(12) United States Patent
Takeuchi

(10) Patent No.: US 11,602,046 B2
(45) Date of Patent: Mar. 7, 2023

(54) WIRING BOARD

(71) Applicant: KYOCERA Corporation, Kyoto (JP)

(72) Inventor: Hiroshi Takeuchi, Koka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/631,063

(22) PCT Filed: May 6, 2021

(86) PCT No.: PCT/JP2021/017384
§ 371 (c)(1),
(2) Date: Jan. 28, 2022

(87) PCT Pub. No.: WO2021/241155
PCT Pub. Date: Dec. 2, 2021

(65) Prior Publication Data
US 2022/0287176 A1    Sep. 8, 2022

(30) Foreign Application Priority Data

May 28, 2020   (JP) .............................. JP2020-093309

(51) Int. Cl.
*H05K 1/11*   (2006.01)
*H05K 1/03*   (2006.01)
*H05K 1/02*   (2006.01)

(52) U.S. Cl.
CPC ......... *H05K 1/0366* (2013.01); *H05K 1/0298* (2013.01); *H05K 1/115* (2013.01)

(58) Field of Classification Search
CPC ..... H05K 1/0366; H05K 1/0298; H05K 1/115
See application file for complete search history.

(56) References Cited

U.S. PATENT DOCUMENTS

| 2007/0199733 A1* | 8/2007 | Murai | H05K 3/421 |
| | | | 174/250 |
| 2010/0254098 A1* | 10/2010 | Tsukada | H05K 3/4602 |
| | | | 174/262 |
| 2012/0132462 A1* | 5/2012 | Harazono | H05K 3/42 |
| | | | 174/260 |

(Continued)

FOREIGN PATENT DOCUMENTS

| JP | 05-235544 A | 9/1993 |
| JP | 2005-123215 S | 5/2005 |

(Continued)

*Primary Examiner* — Steven T Sawyer
(74) *Attorney, Agent, or Firm* — Volpe Koenig

(57) ABSTRACT

A wiring board according to the present disclosure includes a core board including an upper surface, a lower surface, a through-hole penetrating from the upper surface to the lower surface, and a plurality of glass fibers located inside, and a through-hole conductor located in the through-hole. The through-hole conductor includes a first portion located on an inner wall of the through-hole, and second portions connected to the first portion and located inside the glass fibers. The second portions include portions in a first direction and a second direction intersecting the first direction in a planar direction of the core board, the portions having a shorter length in the planar direction from the inner wall of the through-hole than portions, of the second portions, in directions other than the first direction and the second direction.

6 Claims, 3 Drawing Sheets

(56) References Cited

U.S. PATENT DOCUMENTS

| | | | | |
|---|---|---|---|---|
| 2013/0075146 | A1* | 3/2013 | Fushie | H05K 3/423 |
| | | | | 174/262 |
| 2015/0027758 | A1* | 1/2015 | Maeda | H05K 1/0298 |
| | | | | 174/255 |
| 2015/0034377 | A1* | 2/2015 | Min | H05K 3/0029 |
| | | | | 156/253 |
| 2018/0310405 | A1* | 10/2018 | Iriguchi | H05K 1/0373 |
| 2019/0380203 | A1* | 12/2019 | Ota | H05K 1/0366 |
| 2022/0192018 | A1* | 6/2022 | Sakai | H05K 1/111 |

FOREIGN PATENT DOCUMENTS

| | | |
|---|---|---|
| JP | 2012-134456 A | 5/2005 |
| JP | 2011-108771 A | 6/2011 |
| JP | 2013-073967 A | 4/2013 |
| JP | 2013-093486 A | 5/2013 |

* cited by examiner

WIRING BOARD

TECHNICAL FIELD

The present disclosure relates to a wiring board.

BACKGROUND ART

A wiring board including a core board as described in Patent Document 1 is generally provided with a through-hole conductor formed at least on an inner wall surface of a through-hole penetrating upper and lower surfaces of the core board in order to electrically connect the upper and lower surfaces of the core board. As described in Patent Document 1, the core board may include glass cloth (glass fibers) as a reinforcing member in order to improve strength.

When the core board includes glass fibers, the adhesion of the through-hole conductor formed in the through-hole can sometimes decrease. The reason for this is that the adhesion between the cross section (cutting surface) of the glass fibers exposed on the inner wall surface of the through-hole and the through-hole conductor is weaker than the adhesion between an insulating resin included in the core board on the inner wall surface of the through-hole and the through-hole conductor.

Furthermore, the glass fibers, the insulating resin, and the through-hole conductor (for example, copper) have different coefficients of thermal expansion, and the glass fibers having poor adhesion to the through-hole conductor are easily affected by slippage and the like due to stress caused by a difference in thermal expansion. This results in large, localized strain and loss of conduction reliability.

CITATION LIST

Patent Literature

Patent Document 1: JP 2011-108771 A

SUMMARY

Solution to Problem

A wiring board according to the present disclosure includes a core board including an upper surface, a lower surface, a through-hole penetrating from the upper surface to the lower surface, and a plurality of glass fibers located inside, and a through-hole conductor located in the through-hole. The through-hole conductor includes a first portion located on an inner wall of the through-hole, and second portions connected to the first portion and located inside the glass fibers. The second portions include portions in a first direction and a second direction intersecting the first direction in a planar direction of the core board, the portions having a shorter length in the planar direction from the inner wall of the through-hole than portions, of the second portions, in directions other than the first direction and the second direction.

DESCRIPTION OF EMBODIMENTS

In a wiring board including glass fibers in a core board, the adhesion of a through-hole conductor formed in a through-hole can sometimes decrease as described above, resulting in loss of conduction reliability. There is thus a need for a wiring board with improved adhesion of the through-hole conductor without affecting the conduction reliability and the insulating reliability between adjacent through-hole conductors.

A wiring board according to the present disclosure includes a through-hole conductor including a first portion located on an inner wall of a through-hole, and second portions connected to the first portion and located inside glass fibers. Furthermore, the second portions include portions in a first direction and a second direction intersecting the first direction in a planar direction of the core board, the portions having a shorter length in the planar direction from the inner wall of the through-hole than portions, of the second portions, in directions other than the first direction and the second direction. Thus, according to the present disclosure, a wiring board with improved adhesion of the through-hole conductor is provided without affecting the conduction reliability and the insulating reliability between adjacent through-hole conductors.

The wiring board according to the present disclosure includes a core board and a through-hole conductor as described above. The core board includes an upper surface, a lower surface, a through-hole penetrating from the upper surface to the lower surface, and a plurality of glass fibers located inside. The through-hole conductor is located in the through-hole.

Figure 1A:
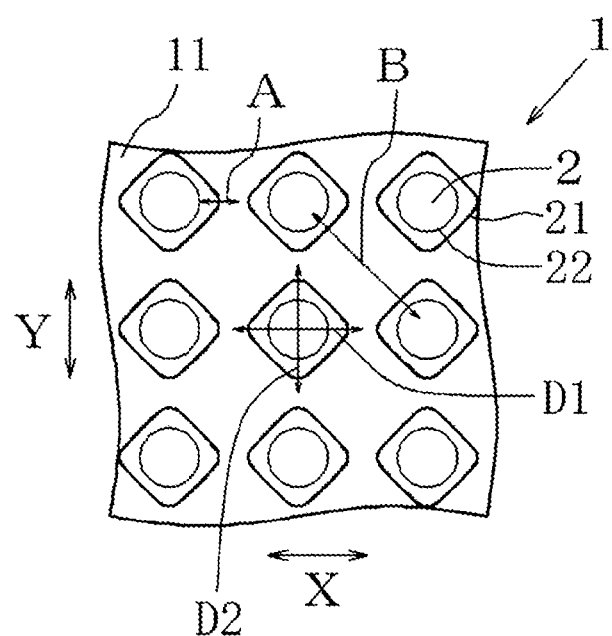
FIG. 1(A) is a schematic view of a core board included in a wiring board according to one embodiment of the present disclosure viewed from an upper surface.
Figure 1B:
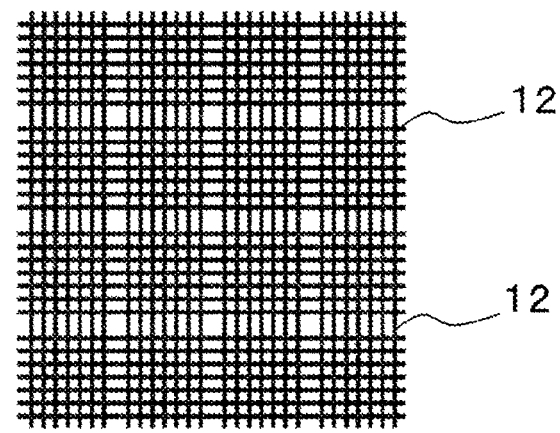
FIG. 1(B) is a schematic view of an arrangement of glass fibers included in the core board viewed from the upper surface.
Figure 1C:
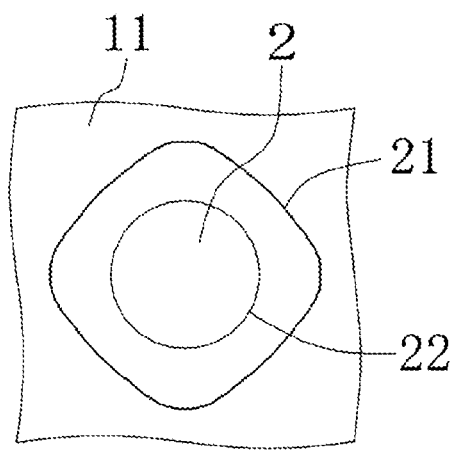
FIG. 1(C) is a schematic view of a through-hole located on the core board viewed from the upper surface.

The wiring board according to an embodiment of the present disclosure will be described with reference to FIGS. 1 to 4. FIG. 1(A) is a schematic view of a core board included in a wiring board according to one embodiment of the present disclosure viewed from the upper surface. The core board 1 illustrated in FIG. 1 is formed of an insulating resin 11 and includes glass fibers 12 as illustrated in FIG. 1(B) as a reinforcing member. FIG. 1(B) is a schematic view of the arrangement of the glass fibers 12 included in the core board 1 as viewed from the upper surface. FIG. 1(C) is a schematic view of a through-hole 2 located in the core board 1 as viewed from the upper surface.

As illustrated in FIG. 1(B), lengthwise directions of the glass fibers 12 in the core board 1 illustrated in FIG. 1(A) are disposed along a lateral direction (X) and a longitudinal direction (Y) of the core board 1. Furthermore, the through-hole 2 including an opening portion 21 having a quadrangular shape is positioned so that the directions along the lengthwise directions of the glass fibers 12 serve as diagonals of the opening portion 21. A plurality of through-holes 2 are located at predetermined intervals in the directions along the diagonals of the opening portions 21.

Examples of the insulating resin 11 include, but are not limited to, an epoxy resin, a bismaleimide-triazine resin, a polyimide resin, a polyphenylene ether resin, and the like. These may be used alone or in combinations of two or more. Furthermore, inorganic insulating fillers made of, for example, silica, barium sulfate, talc, clay, glass, calcium carbonate, or titanium oxide may be dispersed in the insulating resin 11.

The core board 1 has the through-holes 2 each penetrating the upper and lower surfaces of the core board 1. The opening portion 21 of each of the through-holes 2 has a quadrangular shape on the upper surface side of the core board 1. Herein, "quadrangular shape" includes shapes in which at least one of the four corners is rounded, that is, has a round shape, for example, as illustrated in FIG. 1(C). Each side may have a curved shape that bulges outward from the center of the through-hole 2 when the through-hole 2 is viewed in plan view. Furthermore, each side of the quadrangular shape may have a concave-convex corrugated shape.

Figure 2:
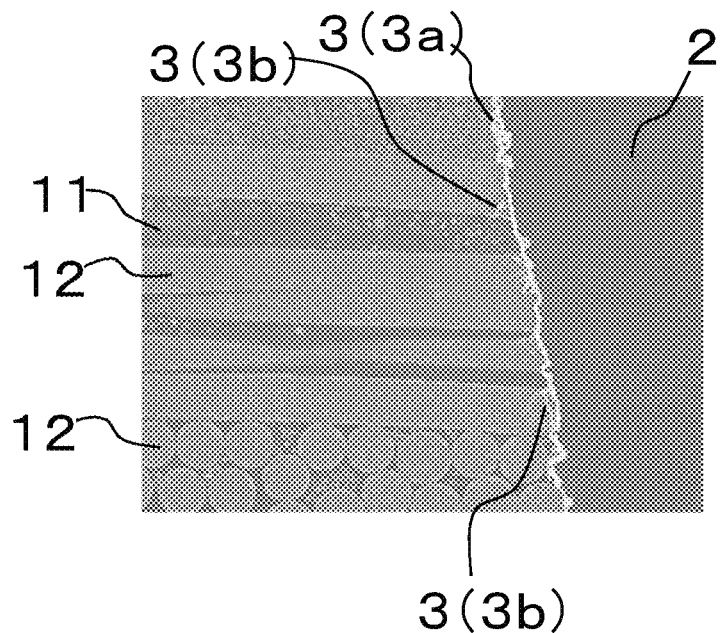
FIG. 2 is an SEM photograph of a cutting surface taken when a portion indicated by arrows A illustrated in FIG. 1 is cut.
Figure 3:
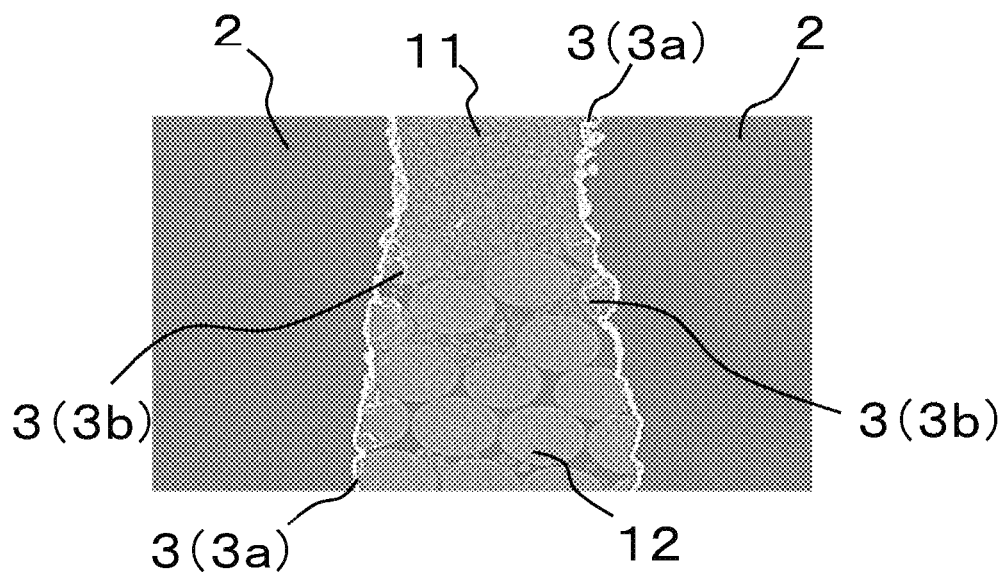
FIG. 3 is an SEM photograph of a cutting surface taken when a portion indicated by arrows B illustrated in FIG. 1 is cut.

As illustrated in FIGS. 2 and 3, a through-hole conductor 3 for electrically connecting the upper and lower surfaces of the core board 1 is formed on an inner wall surface of the through-hole 2. FIGS. 2 and 3 are SEM photographs of cutting surfaces taken when portions indicated by arrows A and B, respectively, illustrated in FIG. 1 are cut. In FIG. 3, the reason why the cutting surfaces of the glass fibers 12 have oval shapes is that the glass fibers 12 are cut obliquely along arrows B.

Figure 4A:
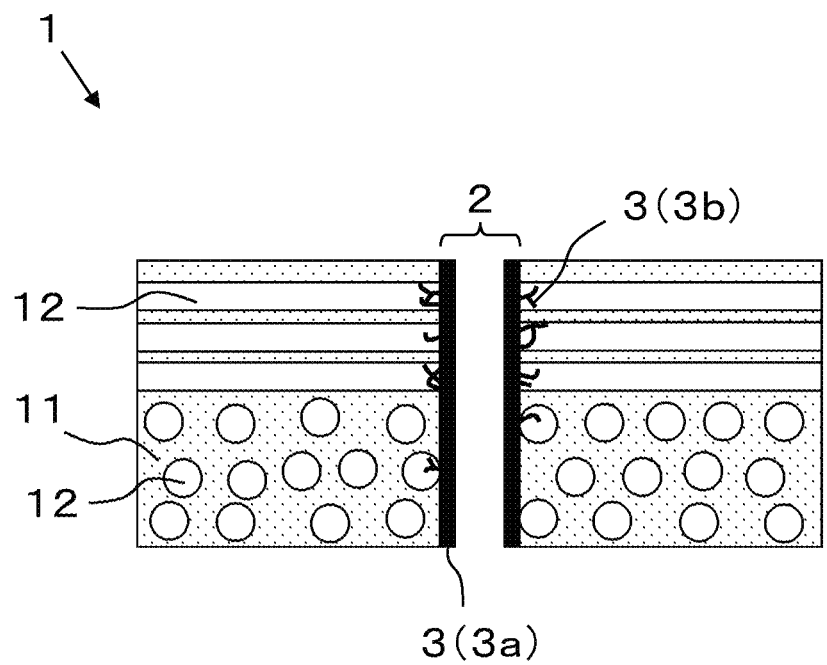
FIGS. 4A-4B are enlarged view illustrating a through-hole located on the core board included in the wiring board according to one embodiment of the present disclosure.
Figure 4B:
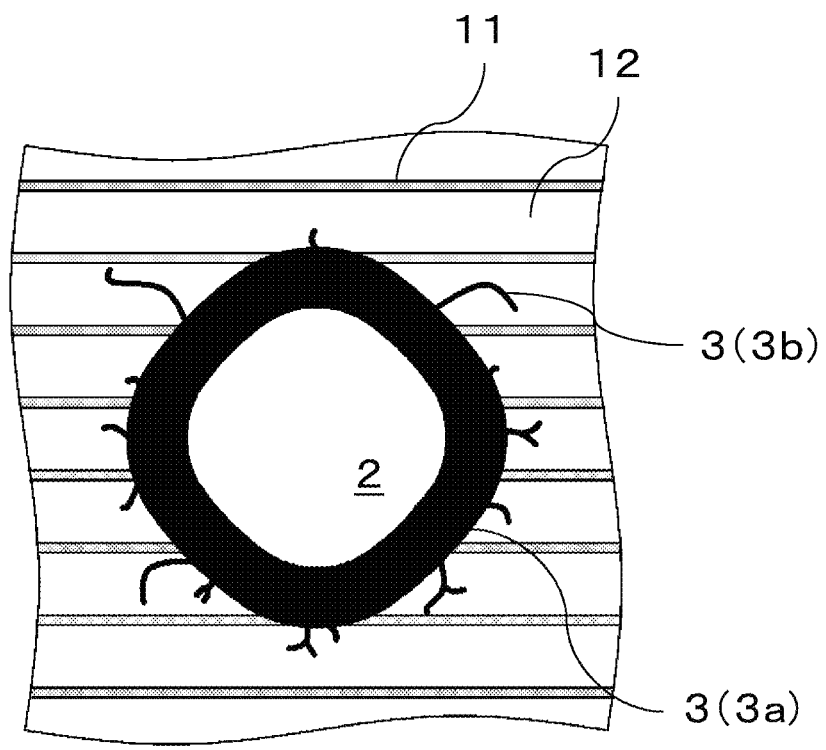

As illustrated in FIGS. 4A-4B, a part of the through-hole conductor 3 located on the inner wall surface of the through-hole 2 is defined as a first portion 3a for convenience of explanation. The through-hole conductor 3 is formed of a conductor made of metal plating such as copper plating, for example. The through-hole conductor 3 may be formed only on the inner wall surface of the through-hole 2 as illustrated in FIGS. 2 and 3, or may fill the through-hole 2.

As illustrated in FIG. 1(B), the glass fibers 12 are disposed longitudinally and laterally in the insulating resin 11. It suffices that at least one layer each of the glass fibers 12 exist longitudinally and laterally, and may be present in the form of glass cloth.

In the wiring board according to one embodiment, voids each having an opening are formed on the inner wall surface of the through-hole 2 in a portion of the glass fibers 12 located inside the core board 1. The voids formed in the glass fibers 12 are filled with portions of the through-hole conductor 3.

As illustrated in FIGS. 4A-4B, the portions of the through-hole conductor 3 located in the voids in the glass fibers 12 are defined as second portions 3b for convenience of explanation. The second portions 3b of the through-hole conductor 3 fill the voids formed in the glass fibers 12 and are connected to the first portion 3a of the through-hole conductor 3. Thus, the through-hole conductor 3 firmly adheres to the glass fibers 12, having poor adhesion, due to an anchoring effect, whereby the adhesion of the through-hole conductor 3 can be ensured across the entire inner wall surface of the through-hole 2. As a result, stress is uniformly dispersed across the inner wall surface of the through-hole 2, whereby conduction reliability can be improved.

Among the glass fibers 12 divided when forming each of the through-holes 2 and having a divided surface located on the inner wall surface of the through-hole 2, the proportion of the glass fibers 12 including the second portions 3b is 30% or more. With this proportion being 30% or more, a stronger anchoring effect is exhibited. As a result, the adhesion between the inner wall surface of the through-hole 2 and the through-hole conductor 3 is further improved.

The size of the second portion 3b formed in the glass fibers 12 is not particularly limited. The width of the second portion 3b is preferably 1 μm or less at the widest portion, for example. The depth of the second portion 3b is preferably 10 μm or less from the opening, for example. If the second portion 3b is of such a size, the strength of the glass fibers 12 as the reinforcing member is not affected. As a result, a stronger anchoring effect can be exhibited. Furthermore, migration between the through-holes 2 adjacent to each other is not affected.

The second portion 3b may be located in the glass fibers 12 except for the portion connected to the first portion 3a. In other words, the voids in the glass fibers 12 in which the second portions 3b are located may have openings only on the inner wall surface of the through-hole 2. In such a case, the strength of the glass fibers 12 can be maintained compared with a case where the second portions 3b are located in voids having a plurality of openings other than the inner wall surface of the through-hole 2. This is thus advantageous in that damage to the glass fibers 12 around the second portion 3b can be reduced even when a large stress is applied to the second portions 3b.

Each of the second portions 3b of the through-hole conductor 3 may have a hook shape in the glass fibers 12. The "hook shape" refers to a shape in which the second portion 3b extends with its direction changed by 90° or more at a leading portion extending in a direction opposite to the first portion 3a side. With the second portions 3b having such a shape, the second portions 3b are easily locked to the glass fibers 12, which is advantageous in improving the anchoring effect.

As illustrated in FIG. 1(A), in the wiring board according to the present disclosure, the second portions 3b of the through-hole conductor 3 include portions in a first direction D1 and a second direction D2 intersecting the first direction D1 in a planar direction of the core board 1, the portions having a shorter length in the planar direction from the inner wall of the through-hole 2 than portions, of the second portions 3b, in directions other than the first direction D1 and the second direction D2. The first direction D1 and the second direction D2 are not particularly limited. In the present disclosure, as illustrated in FIG. 1(A), the first direction D1 and the second direction D2 correspond to the two diagonal directions of the opening portion 21 having a quadrangular shape of the through-hole 2. That is, in plan view, the length in the planar direction of the second portions 3b of the through-hole conductor 3 located in the diagonal directions is shorter than the length in the planar direction of the second portions 3b of the through-hole conductor 3 located in directions other than the diagonal directions.

In the wiring board according to the present disclosure, the length of the second portions 3b, as illustrated in FIG. 3, located, for example, in directions other than the first direction D1 and the second direction D2 (other than the diagonal directions), that is, in the directions of arrows B in FIG. 1(A), is approximately 6.5 μm. On the other hand, the length of the second portions 3b, as illustrated in FIG. 2, located in the first direction D1 and the second direction D2 (diagonal directions), that is, in the directions of arrows A in FIG. 1(A), is approximately 3.8 μm, which is about 60% of the aforementioned length.

The lengths of the second portions 3b in each direction may be measured and compared, for example, as follows. First, electron micrographs of a cross section (D1 cross section) in the first direction D1 passing through the center of the opening portion 21, a cross section (D2 cross section) in the second direction D2 passing through the center of the opening portion 21, and a cross section (D3 cross section) passing through the center of the opening portion 21 and along either side of the opening portion 21 are taken. Next, the lengths of the second portions 3b, observed in each of the D1 cross section to the D3 cross section, entering in the planar direction with respect to the inner wall of the through-hole 2 are measured. Next, an average value of the lengths of the second portions 3b observed in the D3 cross section is compared with an average value of the lengths of the second portions 3b observed in the D1 cross section and the D2 cross section. The length is measured in each cross section, for example, at three points.

In this way, in a case where the first direction D1 and the second direction D2 correspond to the diagonal directions of a quadrangular shape, for example, as illustrated in FIG. 1(A), when the plurality of through-holes 2 are located in rows and columns with a predetermined center-to-center distance, the length in the planar direction of the second portion 3b in the diagonal directions, which are the closest distance between the through-holes 2 adjacent to each other, is small. This is advantageous in that short circuiting due to migration can be reduced. The center-to-center distance refers to the distance between the centers of the opening portions 21 of the through-holes 2 positioned next to each other.

Furthermore, the glass fibers 12 located inside the core board 1 preferably have a lengthwise direction located in a direction along the first direction D1 and in a direction along the second direction D2 in the planar direction of the core board 1. In this way, when the glass fibers 12 are located in the directions along the first direction D1 and the second direction D2, the length of the second portions 3b of the through-hole conductor 3 entering in the lengthwise direction of the glass fibers 12 is smaller. This is advantageous in that short circuiting due to migration between the through-holes 2 adjacent to each other can be reduced.

The second portions 3b of the through-hole conductor 3 may include portions in the first direction D1 and the second direction D2, the portions in the planar direction from the inner wall of the through-hole 2 having a smaller length than portions in directions other than the first direction D1 and the second direction D2 across the thickness direction of the core board 1. This is advantageous in that short circuiting due to migration between the through-holes 2 adjacent to each other across the entire depth direction of the through-hole 2 can be further reduced.

The entire structure of the wiring board according to one embodiment is not particularly limited as long as the core board 1 has the structure as described above. In the wiring board according to one embodiment, for example, a wiring conductor layer may be formed on the surface of the core board 1, and a build-up layer in which an insulating resin layer and a wiring conductor layer are layered may be formed on at least one surface of the core board 1 as necessary.

A method of manufacturing the wiring board according to the present disclosure is not particularly limited as long as the wiring board having the structure as described above can be manufactured. One embodiment of a method of manufacturing the wiring board according to the present disclosure will now be described.

First, the core board 1 is prepared. The core board 1 is formed of the insulating resin 11, and includes the glass fibers 12 as a reinforcing member. Examples of the material of such a core board 1 include a prepreg including the glass fibers 12 impregnated with a resin such as the above-described epoxy resin, bismaleimide-triazine resin, and the like. Furthermore, an inorganic insulating filler made of, for example, the above-described silica, barium sulfate, or talc may be dispersed in the resin.

The through-holes 2 are formed in the material of this core board 1. A method of forming the through-holes 2 is not particularly limited. Since in the glass fibers 12, voids each having an opening are easily formed on the inner wall surface of the through-holes 2, the through-holes 2 are formed by sandblasting, for example.

In the case where each of the through-holes 2 is formed by sandblasting, the opening portion 21 of the through-hole 2 is preferably formed to have a quadrangular shape on the upper surface side of the core board 1. To make the opening portion 21 of the through-hole 2 have a quadrangular shape, it suffices that an opening in a resist has a quadrangular shape. With the resist having the opening with a quadrangular shape, it is difficult for abrasive sandblasting grains to enter the four corners of the opening. As a result, the force required for excavating the corners is reduced, whereby damage to the glass fibers 12 corresponding to the corners is reduced. Thus, large cracks (voids) are less likely to be created in the glass fibers 12, and relatively small voids are created. As a result, the insulating reliability between adjacent through-hole conductors is not affected while the adhesion due to the above-described anchoring effects is ensured.

To form the through-holes 2 by sandblasting, the supply pressure of grinding abrasive grains (the spray pressure for the grinding abrasive grains) is preferably set to approximately 0.15 MPa or more and 0.25 MPa or less. The supply amount of the grinding abrasive grains is preferably approximately from 30 g/min or more and 150 g/min or less. By spraying the grinding abrasive grains with this degree of pressure and supply amount, voids can be formed in the glass fibers 12 without affecting the strength of the glass fibers 12 as the reinforcing member. As a result, clogging of the through-holes 2 with the grinding abrasive grains can be reduced.

The grinding abrasive grains preferably have a crushed shape. In comparison to spherical grinding abrasive grains, pointed parts of the grinding abrasive grains are more likely to catch on the glass fibers 12 when forming the through-holes. As a result, the energy of the grinding abrasive grains is easily transmitted, and the glass fibers 12 can be broken to efficiently form voids. When the diameter of the glass fibers 12 is reduced under the same processing conditions, the energy that the grinding abrasive grains transfer to a single glass fiber 12 becomes smaller, and the size of the voids can be reduced.

In other words, the width and depth of the second portions 3b can be reduced. When the diameter of the glass fibers 12 is reduced without changing the volume of the glass fibers 12 included in the core board 1, the width and depth of the second portions 3b can be reduced while the strength of the core board 1 is maintained. As a result, this is advantageous in that the insulating reliability can be improved in the case where the interval between the through-holes 2 is small, for example.

Examples of the grinding abrasive grains include alumina, silicon carbide, zirconia, and the like having a hardness higher than that of glass.

After each of the through-holes 2 is formed, the through-hole conductor 3 is formed at least on the inner wall surface of the through-hole 2. The through-hole conductor 3 is formed of metal plating, such as electroless copper plating and electrolytic copper plating, for example. The through-hole conductor 3 may be formed only in the voids and on the inner wall surface of the through-hole 2 as illustrated in FIGS. 2 and 3, or may fill the through-hole 2. If the through-hole 2 is filled, conduction resistance can be reduced, which is advantageous in improving electrical properties.

When the metal plating precipitates in the through-hole 2, the plating solution flows through the opening into the voids formed in the glass fibers 12 each having an opening on the inner wall surface of the through-hole 2. As a result, the metal precipitates also in the voids, and the second portions 3b formed from parts of the through-hole conductor 3 and connected to the first portion 3a of the through-hole conductor 3 are formed.

After the core board 1 is formed in this manner, a build-up layer in which an insulating resin layer and a wiring conductor layer are layered may be formed on at least one surface of the core board 1 as necessary.

The wiring board of the present disclosure is not limited to the above-described embodiments. In the wiring board according to one embodiment, the shape of the opening portion 21 of each of the through-holes 2 is such that only the upper surface side of the core board 1 has a quadrangular shape, and an opening portion 22 on the lower surface side of the core board 1 has a shape that is close to a circular shape.

For example, in the case of forming the through-holes 2 by sandblasting as described above, when the abrasive grains are sprayed from the upper surface side of the core board 1, the pressure for spraying is weakened by the time the abrasive grains reach the lower surface side. For this reason, the opening portion 22 on the lower surface side of the core board 1 is unlikely to have a shape similar to the shape of the opening on the upper surface side, and often has a circular shape.

The opening portion of each of the through-holes does not necessarily have a quadrangular shape only on the upper surface side of the core board, and preferably has a quadrangular shape on at least one of the upper surface side and the lower surface side of the core board. For example, when the abrasive grains are sprayed from the lower surface side of the core board, the lower surface side of the core board has a quadrangular shape, and the upper surface side has a shape that is close to a circular shape. Furthermore, when the abrasive grains are sprayed on both the upper surface side and the lower surface side of the core board, the opening portion of the through-hole has a quadrangular shape on both the upper surface side and the lower surface side of the core board.

REFERENCE SIGNS LIST

1 Core board
11 Insulating resin
12 Glass fiber
2 Through-hole
21 Opening portion of through-hole
3 Through-hole conductor
3a First portion
3b Second portion
D1 First direction
D2 Second direction

The invention claimed is:

1. A wiring board comprising: a core board comprising an upper surface, a lower surface, a through-hole penetrating from the upper surface to the lower surface, and a plurality of glass fibers located inside; a through-hole conductor located in the through-hole, wherein
the through-hole conductor comprises a first portion located on an inner wall of the through-hole, and a second portion connected to the first portion and extended inside the glass fibers from the inner wall of the through-hole,
the second portion comprise protrusions located in an intersecting direction where a first direction and a second direction intersect each other in a planar direction of the core board, and protrusions located in other directions than the intersecting direction,
the protrusions located in the intersecting direction extend from the inner wall in the first direction and the second direction intersecting each other in the plane direction of the core board, the protrusions located in the other directions extend from the inner wall in the planar direction other than the first direction and the second direction, and a length of the protrusions located in the intersecting direction is shorter than a length of the protrusions in the other directions in the planar direction.

2. The wiring board according to claim 1, wherein
an opening portion of the through-hole has a quadrangular shape on at least one of an upper surface side and a lower surface side of the core board, and the first direction and the second direction are diagonal directions of the quadrangular shape.

3. The wiring board according to claim 1, wherein
the glass fibers are located in a direction along the first direction and in a direction along the second direction among the planar directions of the core board.

4. The wiring board according to claim 1, wherein
the core board comprises a plurality of through-holes located adjacent to each other in at least one direction of the first direction and the second direction.

5. The wiring board according to claim 2, wherein
the opening portion of the through-hole has a quadrangular shape on both the upper surface side and the lower surface side of the core board.

6. The wiring board according to claim 1, wherein
the through-hole conductor has portions in the first direction and the second direction, the portions having a smaller length in the planar direction from the inner wall of the through-hole than portions, of the through-hole conductor, in directions other than the first direction and the second direction across a thickness direction of the core board.

* * * * *